(12) United States Patent
Tanaka et al.

(10) Patent No.: US 12,306,374 B2
(45) Date of Patent: May 20, 2025

(54) METHOD FOR PRODUCING THIN FILM, THIN FILM FORMING MATERIAL, OPTICAL THIN FILM, AND OPTICAL MEMBER

(71) Applicant: NICHIA CORPORATION, Anan (JP)

(72) Inventors: Gentaro Tanaka, Tokushima (JP); Hirofumi Tanaka, Tokushima (JP)

(73) Assignee: NICHIA CORPORATION, Anan (JP)

( * ) Notice: Subject to any disclaimer, the term of this patent is extended or adjusted under 35 U.S.C. 154(b) by 428 days.

(21) Appl. No.: 17/664,637

(22) Filed: May 23, 2022

(65) Prior Publication Data

US 2022/0283339 A1   Sep. 8, 2022

Related U.S. Application Data

(62) Division of application No. 16/038,824, filed on Jul. 18, 2018, now Pat. No. 11,372,136.

(30) Foreign Application Priority Data

Jul. 19, 2017   (JP) ................. 2017-140214

(51) Int. Cl.
  *G02B 1/11*   (2015.01)
  *C01B 33/113*   (2006.01)
  (Continued)

(52) U.S. Cl.
  CPC .............. *G02B 1/11* (2013.01); *C01B 33/113* (2013.01); *C03C 17/007* (2013.01);
  (Continued)

(58) Field of Classification Search
  CPC .... G02B 1/11; G02B 1/113; G02B 2207/109; C23C 14/243; C23C 14/08;
  (Continued)

(56) References Cited

U.S. PATENT DOCUMENTS 7,445,813 B2   11/2008   Ohbayashi
9,212,088 B2   12/2015   Takashima et al.
(Continued)

FOREIGN PATENT DOCUMENTS

CN   1580823 A   2/2005
CN   103260870 A   8/2013
(Continued)

OTHER PUBLICATIONS

Ng ("Acidic Sol-Gel Polymerization of TEOS: Effect of Solution Composition on Cyclization and Bimolecular Condensation Rates", Ng etal, J. Phys. Chem 1996, 100, 12517-12531 (Year: 1996).
(Continued)

*Primary Examiner* — Michael G Miller
(74) *Attorney, Agent, or Firm* — Hunton Andrews Kurth LLP

(57) ABSTRACT

Disclosed are a method for producing an optical thin film having a low refractive index, a thin film forming material, an optical thin film, and an optical member. The method for producing an optical thin film includes forming a vapor deposition film by depositing a thin film forming material on an object in a non-oxidizing atmosphere by a physical vapor deposition method; and bringing the vapor deposition film into contact with a first acidic solution comprising an acidic substance in a range of pH 2.5 or more and pH 3.5 or less to obtain a first thin film having voids, wherein the thin film forming material is a mixture comprising indium oxide and silicon oxide, in which the indium oxide is in a range of 0.230 mol or more and 0.270 mol or less with respect to 1 mol of the silicon oxide.

6 Claims, 2 Drawing Sheets

(51) Int. Cl.

| | |
|---|---|
| *C03C 17/00* | (2006.01) |
| *C03C 17/245* | (2006.01) |
| *C03C 17/34* | (2006.01) |
| *C23C 14/08* | (2006.01) |
| *C23C 14/24* | (2006.01) |
| *C23C 14/58* | (2006.01) |
| *G02B 1/113* | (2015.01) |

(52) U.S. Cl.
CPC ........ *C03C 17/245* (2013.01); *C03C 17/3417* (2013.01); *C23C 14/08* (2013.01); *C23C 14/243* (2013.01); *C23C 14/5873* (2013.01); *G02B 1/113* (2013.01); *C03C 2217/23* (2013.01); *C03C 2217/475* (2013.01); *C03C 2218/113* (2013.01); *C03C 2218/154* (2013.01); *C03C 2218/33* (2013.01); *G02B 2207/109* (2013.01)

(58) Field of Classification Search
CPC ... C23C 14/5873; C23C 14/086; C23C 14/10; C23C 14/24; C03C 17/3417; C03C 17/245; C03C 17/007; C03C 2218/154; C03C 2218/33; C03C 2217/23; C03C 2217/475; C03C 2218/113; C01B 33/113
See application file for complete search history.

(56) References Cited

U.S. PATENT DOCUMENTS

| | | | |
|---|---|---|---|
| 9,915,761 | B2 | 3/2018 | Ishizawa et al. |
| 10,252,494 | B2 | 4/2019 | Berard et al. |
| 2003/0143401 | A1 | 7/2003 | Hukari et al. |
| 2004/0241931 | A1* | 12/2004 | Akimoto .......... H10K 59/80517 257/E27.111 |
| 2005/0030629 | A1* | 2/2005 | Kursawe ................ G02B 1/116 359/586 |
| 2006/0154044 | A1 | 7/2006 | Yamada et al. |
| 2007/0273973 | A1 | 11/2007 | Kursawe et al. |
| 2008/0002259 | A1 | 1/2008 | Ishizawa et al. |
| 2008/0266661 | A1 | 10/2008 | Nakamura |
| 2010/0208349 | A1 | 8/2010 | Beer et al. |
| 2011/0122497 | A1 | 5/2011 | Ishizawa et al. |
| 2012/0058261 | A1 | 3/2012 | Ishizawa et al. |
| 2013/0279007 | A1 | 10/2013 | Kawai et al. |
| 2014/0029573 | A1 | 1/2014 | Lee et al. |
| 2015/0362633 | A1 | 12/2015 | Ishizawa et al. |
| 2016/0325528 | A1 | 11/2016 | Berard et al. |

FOREIGN PATENT DOCUMENTS

| | | |
|---|---|---|
| EP | 1406847 B1 | 11/2007 |
| EP | 2259097 A2 | 12/2010 |
| EP | 2657011 A1 | 10/2013 |
| JP | S63089656 A | 4/1988 |
| JP | H03187955 A | 8/1991 |
| JP | 2002260447 A | 9/2002 |
| JP | 2004182491 A | 7/2004 |
| JP | 2004345223 A | 12/2004 |
| JP | 2005055899 A | 3/2005 |
| JP | 2006215542 A | 8/2006 |
| JP | 2009544491 A | 12/2009 |
| JP | 2010038948 A | 2/2010 |
| JP | 2013144634 A | 7/2013 |
| JP | 2015222450 A | 12/2015 |
| JP | 2017504938 A | 2/2017 |
| WO | 2001071394 A1 | 9/2001 |
| WO | 2006030848 A1 | 3/2006 |
| WO | 2012086806 A1 | 6/2012 |

OTHER PUBLICATIONS

Tsai ("Wet etching mechanisms of ITO films in oxalic acid", Tsai et al. Microelectronic engineering 83 (2006) 536-541) (Year: 2006).

Belton ("An overview of the fundamentals of the chemistry of the chemistry of silica with relevance to biosilification and technological advances", Belton et al FEBS Journal 279 (2012) 1710-1720) (Year: 2012).

Ito data sheet (https://www.indium.com/products/inorganic-compounds/indium-compounds/#indium-tin-oxide, accessed online Sep. 3, 2020) (Year: 2020).

\* cited by examiner

METHOD FOR PRODUCING THIN FILM, THIN FILM FORMING MATERIAL, OPTICAL THIN FILM, AND OPTICAL MEMBER

CROSS-REFERENCE TO RELATED PATENT APPLICATION

This is a divisional application of U.S. patent application Ser. No. 16/038,824, filed Jul. 18, 2018, which claims priority to Japanese Patent Application No. 2017-140214, filed on Jul. 19, 2017, the disclosure of which are all hereby incorporated by reference in their entirety.

BACKGROUND

Technical Field

The present invention relates to a method for producing a thin film, a thin film forming material, an optical thin film, and an optical member.

Description of Related Art

Surfaces of camera lenses and telescope lenses are coated with a thin film in order to reduce the reflected light. To obtain an effect of reducing the reflected light on a single layer film, it is effective that an optical thin film having a refractive index close to the square root of a refractive index of an object to be film-formed is formed on the outermost surface of the object to be film-formed. In the case of obtaining an anti-reflection effect to the wide wavelength, it is required to form a multilayer film. Even for such multilayer film, a thin film having a refractive index lower than the square root of a refractive index of the object to be film-formed is required in order to enhance an anti-reflection effect to the oblique incident light.

In order to obtain a thin film having a refractive index lower than the square root of a refractive index of the object to be film-formed, it is useful to contain air having a refractive index of 1.0 in the thin film. Thus, optical thin films containing air by various methods including a sol-gel method have been proposed.

For example, Japanese Unexamined Patent Application Publication No. 2010-38948 discloses an anti-reflection film including: a first layer mainly comprising alumina, which is film-formed by a vacuum vapor deposition method; a second layer formed from at least one material selected from the group consisting of $MgF_2$ and $SiO_2$, which is film-formed by a vacuum vapor deposition method; and a third layer formed from an aggregate of mesoporous silica nanoparticles on the second layer; in order from a glass substrate side.

Further, Japanese Unexamined Patent Application Publication No. 2015-222450 discloses an anti-reflection film including: an inorganic base layer formed from an inorganic material; a surface modified layer including an inorganic oxide such as $SiO_2$; an adhesion layer including a binder such as acrylic resin, which is laminated on the surface modified layer; and a low refractive index layer formed by binding hollow silica particles with the binder; on a substrate.

International Unexamined Patent Publication No. 2006/030848 discloses a method for producing an optical thin film, in which a mixture of mixing a sol solution in which magnesium fluoride ($MgF_2$) minute particles are dispersed and an amorphous silicon oxide-based binder is coated on a substrate and subjected to a heat treatment, so that the substrate and the $MgF_2$ minute particles are bound by the amorphous silicon oxide-based binder, and a large number of voids are formed between the $MgF_2$ minute particles.

However, in the optical thin films or the anti-reflection films described in Japanese Unexamined Patent Application Publication No. 2010-38948, Japanese Unexamined Patent Application Publication No. 2015-222450, and International Unexamined Patent Publication No. 2006/030848, the optical thin films are formed by gelating a sol including minute particles and a binder, using a sol-gel method. The thin film formation by the sol-gel method is performed in the air. Thus, in the case of forming a lower layer than the outermost layer in the vacuum, there is a problem in that when the vacuum is released to the air for performing the sol-gel method, foreign substances are easily absorbed and eliminating the foreign substances is then needed. In addition, in order to control a film thickness precisely, it is required to strictly manage variation in the viscosity of the sol with time, and it is necessary to form the thin film while monitoring the viscosity of the sol all the time. Thus, the production method may be complicated. Further, there is also a problem in that, in the case of coating the sol onto an object to be film-formed by a dip coating method, an excess amount of the sol is required, and in the case of coating the sol onto an object to be film-formed by a spin coating method, it is difficult to coat on a curved surface in a uniform film thickness.

Accordingly, an embodiment of the present invention is intended to solve the problems as described above, and to provide a method for producing an optical thin film having a low refractive index, a thin film forming material, an optical thin film, and an optical member.

SUMMARY

The present disclosure includes the following embodiments.

A first embodiment of the present disclosure relates to a method for producing an optical thin film including: forming a vapor deposition film by depositing a thin film forming material on an object to be film-formed in a non-oxidizing atmosphere by a physical vapor deposition; and bringing the vapor deposition film into contact with a first acidic solution containing an acidic substance in a range of pH 2.5 or more and pH 3.5 or less to obtain a first thin film having voids, wherein a mixture containing indium oxide and silicon oxide, in which the content of the indium oxide is 0.230 mol or more and 0.270 mol or less relative to 1 mol of the silicon oxide, is used as the thin film forming material.

A second embodiment of the present disclosure relates to a thin film forming material containing a mixture containing indium oxide and silicon oxide, in which the indium oxide is contained in a range of 0.230 mol or more and 0.270 mol or less relative to 1 mol of the silicon oxide.

A third embodiment of the present disclosure relates to an optical thin film containing silicon oxide, wherein the refractive index is 1.300 or less.

A fourth embodiment of the present disclosure relates to an optical thin film containing silicon oxide, wherein the optical thin film is silica-coated, and the refractive index is 1.380 or less.

A fifth embodiment of the present disclosure relates to an optical member including an object and the optical thin film formed on the object.

In accordance with the embodiments of the present disclosure, a method for producing an optical thin film having a low refractive index, a thin film forming material, an optical thin film, and an optical member can be provided.

DETAILED DESCRIPTION

Figure 1:
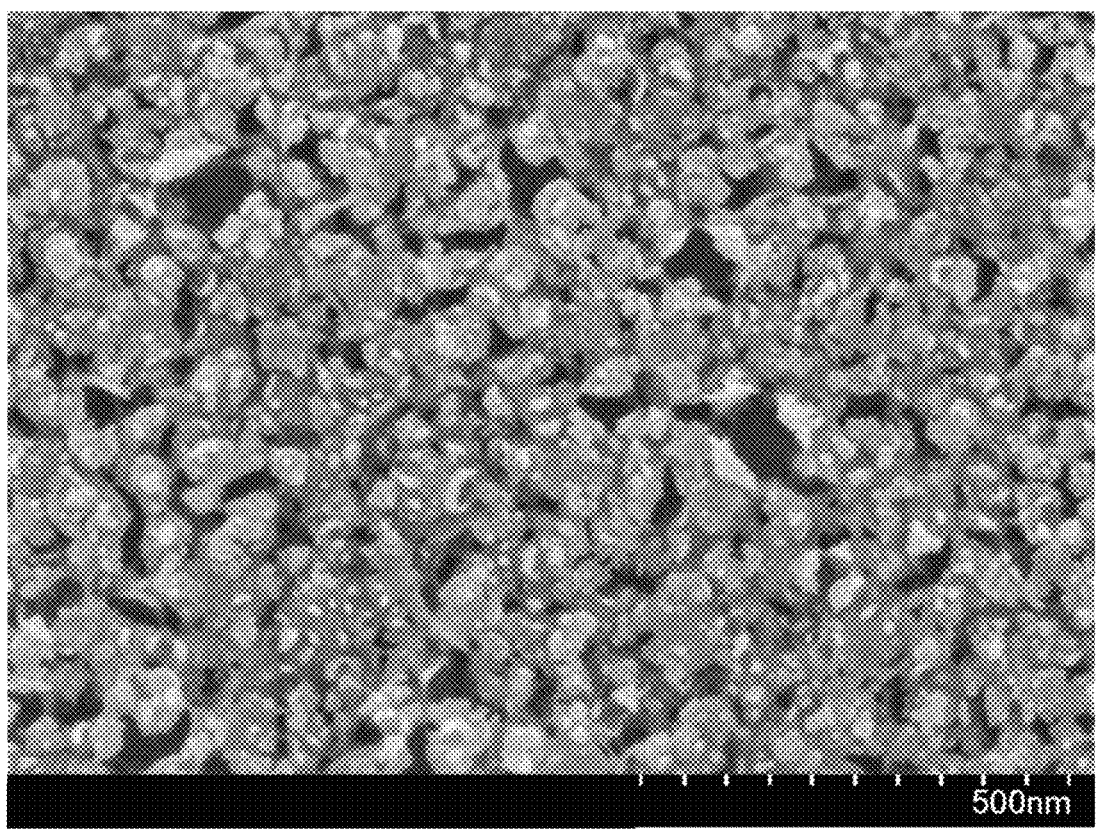
FIG. 1 is a scanning electron microscope (SEM) micrograph showing a surface of an optical thin film according to Example 1 of the present disclosure.

A method for producing a thin film, a thin film forming material, an optical thin film, and an optical member according to the present disclosure will be hereunder described based on embodiments thereof. The embodiments shown below are exemplifications for exemplifying the technical idea of the present invention, and the present invention is not limited to the method for producing the thin film, the thin film forming material, the optical thin film, and the optical member described below.

Method for Producing Thin Film

An embodiment of the present disclosure is a method for producing a thin film including: forming a vapor deposition film by depositing a thin film forming material on an object in a non-oxidizing atmosphere by a physical vapor deposition; and bringing the vapor deposition film into contact with a first acidic solution containing an acidic substance in a range of pH 2.5 or more and pH 3.5 or less so as to obtain a thin film having voids, wherein a mixture containing indium oxide and silicon oxide, in which the indium oxide is contained in a range of 0.230 mol or more and 0.270 mol or less relative to 1 mol of the silicon oxide is used as the thin film forming material.

Thin Film Forming Material

A thin film forming material according to an embodiment of the present disclosure is a mixture containing indium oxide and silicon oxide, in which the indium oxide is contained in a range of 0.230 mol or more and 0.270 mol or less with respect to 1 mol of the silicon oxide.

The indium oxide to be used for a raw material of the thin film forming material is preferably indium oxide (III) ($In_2O_3$). The indium oxide (III) ($In_2O_3$) may contain inevitable impurities. The content of the indium oxide (III) ($In_2O_3$) in the indium oxide (III) ($In_2O_3$) to be used as a raw material is preferably 90% by mass or more, more preferably 95% by mass or more, even more preferably 99% by mass or more.

The silicon oxide to be used for a raw material of the thin film forming material contains preferably a silicon monoxide (SiO) as a major component. In the present specification, the expression "silicon monoxide (SiO) as a major component" means that the content of the silicon monoxide (SiO) in the silicon oxide as a raw material contains 50% by mass or more. The content of the silicon monoxide (SiO) in the silicon oxide as a raw material contains more preferably 80% by mass or more, even more preferably 90% by mass or more, still more preferably 99% by mass or more.

The thin film forming material may be a mixture containing indium oxide (III) ($In_2O_3$) and silicon oxide as raw materials, and containing a silicon monoxide (SiO) as a major component of the silicon oxide. The content of the indium oxide (III) ($In_2O_3$) in the thin film forming material is in a range of 0.230 mol or more and 0.270 mol or less relative to 1 mol of the silicon oxide. Using the thin film forming material, a vapor deposition film containing a silicon dioxide ($SiO_2$) and indium oxide (I) ($In_2O$) can be formed on an object in a non-oxidizing atmosphere by a physical vapor deposition. In the vapor deposition film, an extremely trace amount of the indium oxide (III) ($In_2O_3$) and/or indium (In) may be contained. The indium oxide (III) ($In_2O_3$) contained in the thin film forming material is dissociated into indium oxide (I) ($In_2O$), indium (In), and oxygen (O) by heating. The silicon monoxide (SiO) contained in the thin film forming material is preferentially reacted with oxygen (O) to generate a silicon dioxide ($SiO_2$) since a standard formation free energy for oxidizing the silicon monoxide (SiO) is lower than a standard formation free energy for oxidizing the indium oxide (I) ($In_2O$). Even in the case where the vapor deposition film is formed using the thin film forming material in a non-oxidizing atmosphere, oxygen (O) which is dissociated from the indium oxide (III) ($In_2O_3$) is preferentially absorbed into the silicon monoxide (SiO) to generate a silicon dioxide ($SiO_2$). Thus, the silicon monoxide (SiO) remains little in the vapor deposition film. A first thin film (an optical thin film) obtained by bringing the vapor deposition film into contact with a first acidic solution does not absorb visible light derived from the silicon monoxide (SiO) of which the body color is black. In addition, since the oxygen (O) which is dissociated from the indium oxide (III) ($In_2O_3$) contained in the thin film forming material is reacted with the silicon monoxide (SiO) to generate the silicon dioxide ($SiO_2$), generation of the indium oxide (III) ($In_2O_3$) caused by further oxidizing the dissociated indium oxide (I) ($In_2O$) can be suppressed. The indium oxide (I) ($In_2O$) has very high dissolubility to an acidic substance. Thus, the indium oxide (I) ($In_2O$) is preferentially eluted by bringing the vapor deposition film into contact with the first acidic solution containing the acidic substance, and the first thin film (optical thin film) which has voids satisfying a desired refractive index, and contains the silicon dioxide ($SiO_2$) as a framework can be then obtained.

As to the indium (In) generated by dissociating the indium oxide (III) ($In_2O_3$), an amount of indium (In) gas contained in the atmosphere where the indium oxide (III) ($In_2O_3$) is dissociated is about 3% by volume to 5% by volume ("Thermodynamics of Oxides" written by Kulikov, I. S. and published by Nisso-Tsushinsya, p. 146, 1987), and an extremely trace amount of the indium (In) may be contained in the atmosphere when the vapor deposition film is formed.

In the case where the indium (In) is present in the vapor dissociated from the indium oxide (III) ($In_2O_3$), since a standard formation free energy for oxidizing the indium (In) to the indium oxide (III) ($In_2O_3$) is much lower than a standard formation free energy for oxidizing the silicon monoxide (SiO) to the silicon dioxide ($SiO_2$), it may cause indium oxide (III) ($In_2O_3$) which is generated again by reacting the indium (In) with oxygen, to be contained in the vapor deposition film.

However, in the vapor deposition film which is formed using the thin film forming material comprising the indium oxide (III) ($In_2O_3$) and the silicon monoxide (SiO), in which the indium oxide is contained in a range of 0.230 mol or more and 0.270 mol or less relative to 1 mol of the silicon oxide, only an extremely trace amount of the indium oxide (III) ($In_2O_3$) and/or indium (In) is contained, as described below.

In the case where the indium oxide (III) ($In_2O_3$) is present in the vapor deposition film, when the first thin film is further immersed into the strong acidic solution having a pH 2.0 or less, a refractive index of the first thin film is decreased even if a transparent first thin film may be obtained by bringing the vapor deposition film into contact with the first acidic solution. In the case where a refractive index of the first thin film which is brought into contact with a strong acidic solution is decreased, it can be confirmed that the indium oxide (III) ($In_2O_3$) remains in the first thin film. In the case of containing the indium (In) in the vapor deposition film, when the vapor deposition film is brought into contact with the first acidic solution, a body color of the thin film is changed from black to gray, and thereafter becomes transparent. Thus, it can be confirmed that the indium (In) remains in the vapor deposition film.

When a molar ratio of the indium oxide (III) ($In_2O_3$) contained in the thin film forming material relative to 1 mol of the silicon oxide is less than 0.230, a silicon monoxide (SiO) which is not oxidized remains in the vapor deposition film since the content of the indium oxide (III) ($In_2O_3$) in the thin film forming material is too small. When the silicon monoxide (SiO) remains in the vapor deposition film, the silicon monoxide (SiO) is not eluted even by bringing the vapor deposition film into contact with the first acidic solution, and the silicon monoxide (SiO) of which the body color is black remains in the obtained first thin film (the optical thin film). Remaining the silicon monoxide (SiO) in the first thin film (the optical thin film) causes absorption of visible light derived from the silicon monoxide (SiO) in the first thin film (the optical thin film) to be increased. Also, when the silicon monoxide (SiO) which is not oxidized remains in the vapor deposition film, the silicon monoxide (SiO) is not eluted from the vapor deposition film even by bringing the vapor deposition film into contact with the first acidic solution. Thus, desired voids are not formed, and a first thin film (the optical thin film) having voids, which satisfies a desired refractive index, is hardly formed.

When a molar ratio of the indium oxide (III) ($In_2O_3$) contained in the thin film forming material related to 1 mol of the silicon oxide is more than 0.270, a large amount of indium oxide (I) ($In_2O$) and/or indium (In) is generated in the vapor deposition film since the content of the indium oxide (III) ($In_2O_3$) is too large. Thus, in the case of bringing the vapor deposition film into contact with the first acidic solution, since the content of the eluted indium oxide (I) ($In_2O$) and/or indium (In) is too large, the number of voids becomes too large, strength of the first thin film (optical thin film) which contains the silicon dioxide ($SiO_2$) as a framework is decreased, and the first thin film is then easily detached from the object to be film-formed. Further, due to excess oxygen generated by dissociating the excess indium oxide (III) ($In_2O_3$), the indium oxide (I) ($In_2O$) and/or indium (In) is oxidized to form indium oxide (III) ($In_2O_3$), and a refractive index of the first thin film may be increased.

A molar ratio of the indium oxide (III) ($In_2O_3$) contained in the thin film forming material relative to 1 mol of the silicon oxide is in a range of 0.230 or more and 0.270 or less, preferably in a range of 0.240 or more and 0.270 or less, more preferably in a range of 0.240 or more and 0.265 or less, even more preferably in a range of 0.250 or more and 0.260 or less, still more preferably in a range of 0.252 or more and 0.258 or less.

The thin film forming material is preferably a sintered mixture (sintered body) obtained by: mixing indium oxide (III) ($In_2O_3$) and silicon oxide (SiO or $SiO_2$) so as to provide a raw material mixture such that the content of the indium oxide is in a range of 0.230 mol or more and 0.270 mol or less relative to 1 mol of the silicon oxide; press-molding the raw material mixture to form a molded article; and thereafter, calcining the molded article. By using the sintered mixture (sintered body) as the thin film forming material, the thin film forming material is nearly uniformly vaporized by a physical vapor deposition, and the vapor deposition film, in which the indium oxide (I) ($In_2O$) generated by heat decomposing the indium oxide (III) ($In_2O_3$) and the silicon dioxide ($SiO_2$) are nearly uniformly mixed, can be nearly evenly deposited on a surface of the object to be film-formed.

It is preferable that the molded article formed by press-molding the raw material mixture is calcined in an inert atmosphere. The inert atmosphere means an atmosphere containing argon (Ar) and helium (He) as main components in the atmosphere. The inert atmosphere may inevitably contain oxygen as an impurity. In the present specification, when an oxygen concentration contained in the atmosphere is 15% by volume or less, the atmosphere is referred to as the inert atmosphere. The oxygen concentration in the inert atmosphere is preferably 10% by volume or less, more preferably 5% by volume or less, even more preferably 1% by volume or less. The oxygen concentration in the inert atmosphere is preferably as small as possible. Thus, the oxygen concentration in the inert atmosphere is furthermore preferably 0.1% by volume or less, particularly preferably 0.01% by volume or less, most preferably 0.001% by volume or less (10 ppm by volume or less). By calcining the solid article formed by press-molding the raw material mixture in the inert atmosphere, excess oxides cannot be contained in the thin film forming material as much as possible.

A temperature at which the raw material mixture is calcined to form the sintered body is preferably in a range of 500° C. or more and 900° C. or less, more preferably in a range of 600° C. or more and 880° C. or less, even more preferably in a range of 700° C. or more and 850° C. or less. When the temperature for calcining the raw material mixture is more than the upper limit value, a metal indium (In), which is reduced from the indium oxide (III) ($In_2O_3$), is dissolved and evaporated, and thus a thin film forming material having an intended composition cannot be obtained. When the temperature for calcining the raw material mixture is less than the lower limit value, there is a concern that the sintered mixture (sintered body) as the thin film forming material may be broken by the thermal stress during the vapor deposition since the strength of the sintered body thus obtained by calcining is insufficient. When the sintered body as the thin film forming material is broken during the vapor deposition, there are cases where a stable vapor deposition film cannot be film-formed, since the amount of evaporation is largely changed.

Step of Forming Vapor Deposition Film

In the manufacturing method according to an embodiment of the present disclosure, the thin film forming material is deposited on the object to be film-formed in a non-oxidizing atmosphere by a physical vapor deposition, thereby forming a vapor deposition film.

Examples of the physical vapor deposition may include an electron beam vapor deposition, a resistance heating vapor deposition, an ion plating, and a sputtering. Among others, it is preferable to use the electron beam vapor deposition or the resistance heating vapor deposition, and it is more preferable to use the electron beam vapor deposition. With the electron beam vapor deposition or the resistance heating vapor deposition, a vapor deposition film can be uniformly formed even at a large surface area or a curved surface having a small radius of curvature. In addition, the electron beam vapor deposition has superior thermal efficiency since the thin film forming material is heated by directly irradiating with electron beam. Thus, even a thin film forming material such as an oxide having a high melting point and low thermal conductivity can be efficiently vaporized, and a vapor deposition film having a stable composition, based on a composition of the thin film forming material, can be then formed on the object to be film-formed in a relatively short time. Further, the vapor deposition film may be formed using an ion assist. In the case of using the ion assist, an ion-beam assisted deposition (IAD), having an ion source for the assist in film-forming of the vapor deposition film, in which the vapor deposition film is formed using an ion gun (ion-beam) while acceleratively irradiating the object to be film-formed with gas ions, may be used. The ion source for the ion-beam assist is preferably inert gas ion. An example of the inert gas ion for the ion-beam assist may be an Ar ion or a He ion, and the Ar ion is preferable.

Since the silicon monoxide (SiO) contained in the thin film forming material is a black oxide, there are cases where the silicon monoxide (SiO) of which the body color is black is contained in the vapor deposition film when the vapor deposition film is film-formed in a non-oxidizing atmosphere, and thus a thin film using the vapor deposition film cannot be used as an optical thin film. The reason why the vapor deposition film is nevertheless formed in a non-oxidizing atmosphere, is because the silicon monoxide (SiO) is preferentially reacted with oxygen to generate a silicon dioxide ($SiO_2$), and generation of the indium oxide (III) ($In_2O_3$) having low dissolubility relative to the acidic solution can be suppressed. Since the silicon monoxide (SiO) is more easily oxidized than indium oxide (I) ($In_2O$), the silicon monoxide (SiO) is preferentially oxidized by the oxygen which is dissociated from the indium oxide (III) ($In_2O_3$) contained in the thin film forming material, thereby forming a silicon dioxide ($SiO_2$). On the other hand, the indium oxide (I) ($In_2O$) is hardly oxidized, and thus the indium oxide (III) ($In_2O_3$) formed by oxidizing the indium oxide (I) ($In_2O$) is hardly generated.

The non-oxidizing atmosphere in forming the vapor deposition film may be an inert atmosphere, a reducing atmosphere, and a vacuum, and may be one or more atmospheres of these. The inert atmosphere denotes an inert atmosphere where the oxygen concentration contained in the atmosphere is 15% by volume or less, as well as an inert atmosphere where the molded article formed by press-molding the raw material mixture is calcined. The reducing atmosphere denotes an atmosphere mainly comprising a mixture gas containing hydrogen or carbon monoxide in the atmosphere. The main component in an atmosphere means one or more components comprised in the atmosphere at 50% by volume or more. When two or more components are comprised as the main component, it is sufficient that the total amount of two or more components is comprising in the atmosphere 50% by volume or more. The vacuum denotes an atmosphere where the pressure is $1.0 \times 10^{-5}$ Pa or more and $1.0 \times 10^{-2}$ Pa or less. In the present specification, the vacuum denotes an atmosphere where, without introducing inert gases such as argon (Ar) gas and helium (He) gas as main components in the inert atmosphere, or a mixture gas containing hydrogen or carbon monoxide into the atmosphere, the pressure is $1.0 \times 10^{-5}$ Pa or more and $1.0 \times 10^{-2}$ Pa or less, and the oxygen concentration is 15% by volume or less. In the case where the non-oxidizing atmosphere is a vacuum, a gas component in the atmosphere is mainly steam.

When the non-oxidizing atmosphere in forming the vapor deposition film is the reducing atmosphere where the mixture gas containing hydrogen and carbon monoxide is introduced, or the vacuum, a molar ratio of the indium oxide relative to the silicon oxide ($In_2O_3/SiO$) becomes relatively high. Even in the case of increasing the amount of oxygen generated from the thin film forming material in the steam, the hydrogen or the carbon monoxide contained in the mixture gas in the atmosphere, or the hydrogen contained in the vacuum is preferentially oxidized earlier than oxidizing the indium oxide (I) ($In_2O$) generated from the thin film forming material, and thus generation of the indium oxide (III) ($In_2O_3$) in the vapor deposition film can be suppressed.

An oxygen concentration in the non-oxidizing atmosphere in forming the vapor deposition film may be 15% by volume or less, preferably 10% by volume or less, more preferably 5% by volume or less, even more preferably 1% by volume or less. In order to obtain a first thin film having a desired refractive index, the lower oxygen concentration in the non-oxidizing atmosphere in film-forming the vapor deposition film, the more preferable. Thus, the oxygen concentration in the non-oxidizing atmosphere in film-forming the vapor deposition film is furthermore preferably 0.1% by volume or less, particularly preferably 0.01% by volume or less, most preferably 0.001% by volume or less (10 ppm by volume or less). When the oxygen concentration in the non-oxidizing atmosphere in forming the vapor deposition film is high, the generated indium oxide (I) ($In_2O$) and/or indium (In) is oxidized again, indium oxide (III) ($In_2O_3$) is generated in the vapor deposition film, the indium oxide (III) ($In_2O_3$) is not eluted even by bringing the vapor deposition film into contact with a first acidic solution and remains in the vapor deposition film, and thus there are cases where a thin film having a desired low refractive index cannot be obtained. A refractive index of the indium oxide (III) ($In_2O_3$) is about 2.0 and is relatively high. When the indium oxide (III) ($In_2O_3$) remains in the vapor deposition film, a thin film having a desired low refractive index cannot be obtained. On the other hand, when the oxygen concentration in the non-oxidizing atmosphere in forming the vapor deposition film is low, because of less oxygen in the atmosphere, it can be suppressed that the indium oxide (I) ($In_2O$) generated from the thin film forming material is oxidized again by the oxygen in the atmosphere and indium oxide (III) is then generated in the vapor deposition film.

A pressure in the non-oxidizing atmosphere in forming the vapor deposition film may vary depending on a type of a physical vapor deposition to be used. In the case of using an electron beam vapor deposition as the physical vapor deposition, an atmospheric pressure in forming the vapor deposition film on the object to be film-formed is preferably $1.0 \times 10^{-5}$ Pa or more and $5.0 \times 10^{-2}$ Pa or less, more preferably $1.0 \times 10^{-5}$ Pa or more and $1.0 \times 10^{-2}$ Pa or less, even more preferably $5.0 \times 10^{-5}$ Pa or more and $1.0 \times 10^{-2}$ Pa or less. In the case where the non-oxidizing atmosphere is a vacuum, a pressure in the vacuum atmosphere, in which an inert gas or a mixture gas is not introduced in the atmosphere, may be $1.0 \times 10^{-5}$ Pa or more and $1.0 \times 10^{-2}$ Pa or less. When the atmospheric pressure in forming the vapor deposition film is in the above range, it can be suppressed that the indium oxide (I) ($In_2O$) generated from the thin film forming material is oxidized again by the oxygen in the atmosphere and indium oxide (III) ($In_2O_3$) is then generated in the vapor deposition film. The pressure in the non-oxidizing atmosphere in forming the vapor deposition film can be controlled, for example, by introducing an inert gas such as argon or a mixture gas into a vapor deposition apparatus.

In the manufacturing method according to an embodiment of the present disclosure, an object to be film-formed may be formed of glass, or may be formed of plastic. An example of the glass may be optical glass. Examples of the plastic may include polyester-based resins, acrylic-based resins, polycarbonate-based resins, polyamide-based resins, polyimide-based resins, polyethersulfone-based resins, polysulfone-based resins, and polyolefin-based resins. A form of the object to be film-formed may be, for example, a flat-shaped substrate or a lens-shaped substrate having a curved surface, or may be a flexible sheet. In the manufacturing method according to an embodiment of the present disclosure, a vapor deposition film can be formed even at a relatively low temperature. Thus, the optical thin film having a low refractive index can be formed even if the object to be film-formed is formed from a material having low heat resistance.

Step of Bringing into Contact with First Acidic Solution

The manufacturing method according to an embodiment of the present disclosure includes bringing the vapor deposition film into contact with a first acidic solution comprising an acidic substance in a range of pH 2.5 or more and pH 3.5 or less so as to obtain a first thin film having voids.

The vapor deposition film, which is formed on the object to be film-formed by a physical vapor deposition using a mixture containing indium oxide and silicon oxide as a thin film forming material, in which the indium oxide is contained in a range of 0.230 mol or more and 0.270 mol or less relative to 1 mol of the silicon oxide, contains a silicon dioxide ($SiO_2$) and indium oxide (I) ($In_2O$). Among the substances constituting the vapor deposition film, the indium oxide (I) ($In_2O$) and/or indium (In) has very high dissolubility to an acidic substance. Thus, even if the acidic substance contained in the first acidic solution is a weak acidic substance, the indium oxide (I) ($In_2O$) and/or indium (In) is preferentially eluted by bringing the vapor deposition film into contact with the first acidic solution in a range of pH 2.5 or more and pH 3.5 or less, and a first thin film (optical thin film) having voids satisfying a desired refractive index, in which the framework is constituted of the silicon dioxide ($SiO_2$), can be obtained.

Even in the case where a film having another composition, which is different from the vapor deposition film, is laminated on the vapor deposition film in order to form a multilayer film, since the acidic substance contained in the first acidic solution is a weak acidic substance, the indium oxide (I) ($In_2O$) and/or indium (In) in the vapor deposition film is eluted to form a framework composed of the silicon dioxide ($SiO_2$) without influencing on the film having another composition, and thus the first thin film (optical thin film) having a desired refractive index can be obtained. An example of the composition of the film to be laminated on the vapor deposition film may have, for example, an another composition containing alumina.

In the first thin film (optical thin film) obtained by the manufacturing method according to an embodiment of the present disclosure, the indium oxide (I) ($In_2O$) and/or indium (In), which is easily to be eluted, can be almost all eluted from inside of the vapor deposition film by bringing the vapor deposition film into contact with the first acidic solution, voids are then generated between the silicon dioxides ($SiO_2$), which serve as frameworks, by the elution of the indium oxide (I) ($In_2O$) and/or indium (In), and thus the first thin film (optical thin film) having a high voidage and a low refractive index can be formed.

There are cases where the vapor deposition film contains indium oxide (III) ($In_2O_3$) and/or indium (In). Even in that case, the amount of the indium oxide (III) ($In_2O_3$) and/or indium (In) contained in the vapor deposition film is an extremely trace amount of the extent to which the refractive index of the first thin film is decreased by about 0.01 after bringing the first thin film into contact with a strong acidic solution having a pH 2.0 or less. The extremely trace amount of the extent to which the refractive index of the first thin film is decreased by about 0.01 is an amount of the extent to which the voidage of the first thin film is increased by about 3% by liberating an extremely trace amount of the silicon dioxide ($SiO_2$) together with the extremely trace amount of the indium oxide (III) ($In_2O_3$).

A part of the silicon dioxide ($SiO_2$) in the vapor deposition film is surrounded by the indium oxide (I) ($In_2O$) and/or indium (In). Thus, the part of the silicon dioxide ($SiO_2$) surrounded by the indium oxide (I) may be also liberated from the vapor deposition film at the same time when the indium oxide (I) ($In_2O$) and/or indium (In) is eluted from the vapor deposition film. When the first thin film is brought into contact with a strong acidic solution having a pH 2.0 or less, the extremely trace amount of the silicon dioxide ($SiO_2$) surrounded by the indium oxide (I) ($In_2O$) and/or indium (In), together with the extremely trace amount of the indium oxide (III) ($In_2O_3$) contained in the first thin film, are liberated, the refractive index of the first thin film is then decreased by about 0.01, and the voidage thereof is increased by about 3%.

A body color of the indium oxide (I) ($In_2O$) is black, and thus when the indium oxide (I) ($In_2O$) remains in the first thin film (optical thin film), the first thin film (optical thin film) absorbs visible light. For example, by measuring an absorptivity {100–(transmittance+reflectance)} of the thin film with a spectrometer, it can be confirmed that the absorption rate of the thin film is increased when the thin film absorbs visible light, and the indium oxide (I) ($In_2O$) and/or indium (In) remains in the thin film when the absorption rate is increased.

Examples of the acidic substance contained in the first acidic solution may include inorganic acids such as hydrochloric acid, sulfuric acid, and nitric acid, and organic acids such as acetic acid, citric acid, and oxalic acid. The acidic substance is preferably an acid having a buffer action and having a plurality of acid dissociation constant, more preferably citric acid or oxalic acid which serves as a weak acidic substance. In the acid having no buffer action, a pH value thereof is apt to rise, and thus the acid treatment tends to require a long time.

The pH value of the first acidic solution is in a range of pH 2.5 or more and pH 3.5 or less, preferably in a range of pH 2.7 or more and pH 3.2 or less. When the pH value of the solution containing an acidic substance is lower than 2.5, adhesion between the obtained first thin film and the object to be film-formed becomes low, and the first thin film may be detached from the object to be film-formed after bringing into contact with the solution containing the acidic substance. When the pH value of the first acidic solution is more than 3.5, it is not preferable that, since a dissolution rate of the indium oxide (I) ($In_2O$) and/or indium (In) contained in the vapor deposition film becomes low, it takes a long time until all the indium oxide (I) ($In_2O$) and/or indium (In) are eluted, and the production efficiency is then lowered.

The temperature at which the vapor deposition film is brought into contact with the first acidic solution may be room temperature. The room temperature is in a range of 15° C. or more and 28° C. or less, preferably in a range of 15° C. or more and 25° C. or less. When the temperature at which the vapor deposition film is brought into contact with the first acidic solution is high, the elution of the indium oxide (I) ($In_2O$) and/or indium (In) can be promoted, the contact time can be shortened, and thus it is preferable for the production. When the temperature is too high, a solvent in the first acidic solution is evaporated, and the pH value is decreased. Thus, the producing cost may be increased since a sealed container or equipment for adjusting the pH by continuous monitoring is required. When the temperature is too low, the producing cost may be increased since a cooling apparatus may be required.

The time period in which the vapor deposition film is in contact with the first acidic solution may be a time in which the whole thin film becomes transparent.

Examples of the method for bringing the vapor deposition film into contact with the first acidic solution may generally include a method in which the object to be film-formed, on which the vapor deposition film is formed, is immersed in the first acidic solution, and a method in which only the vapor deposition film, which is formed on the object to be film-formed, is immersed in the first acidic solution. In the method for immersing the vapor deposition film in the first acidic solution, the indium oxide (I) ($In_2O$) and/or indium (In) in the vapor deposition film is eluted after a predetermined time is elapsed. The indium oxide (I) ($In_2O$) and/or indium (In) in the vapor deposition film is eluted, and in some cases the silicon dioxide ($SiO_2$), which is covered with the indium oxide (I) ($In_2O$) and/or indium (In), is eluted together with the indium oxide (I) ($In_2O$) and/or indium (In), thereby obtaining a thin film having voids.

First Thin Film: Optical Thin Film

The first thin film produced by the method according to an embodiment of the present disclosure is an optical thin film comprising silicon oxide, in which the refractive index is 1.300 or less. The first thin film (optical thin film) is an optical thin film having voids formed by eluting the indium oxide (I) ($In_2O$) and/or indium (In) from the vapor deposition film containing the silicon dioxide ($SiO_2$) and the indium oxide (I) ($In_2O$) and/or indium (In), in which the silicon dioxide ($SiO_2$) serves as a framework, and the refractive index is 1.300 or less. The refractive index of the first thin film (optical thin film) is preferably 1.250 or less, more preferably 1.200 or less, even more preferably 1.170 or less. The indium oxide (I) ($In_2O$) and/or indium (In) in the vapor deposition film is eluted to form many voids, and a framework containing silicon dioxide ($SiO_2$) not being eluted remains to obtain the first thin film (optical thin film). The first thin film may contain an extremely trace amount of the indium oxide (III) ($In_2O_3$) other than the silicon dioxide ($SiO_2$). The amount of the indium oxide (III) ($In_2O_3$) in the first thin film may be such that the refractive index of the first thin film is decreased by about 0.01 after bringing the first thin film after being treated with the first acidic solution into contact with a strong acidic solution having a pH 2.0 or less.

In the first thin film as an optical thin film, the refractive index is 1.300 or less, and thus the anti-reflection effect can be enhanced throughout the whole visible region.

The refractive index of the optical thin film can be obtained by measuring a reflection spectrum with a spectrometer, and by measuring a minimum value of a reflected light intensity as a reflectance when an incident light intensity is taken as 100, followed by calculating from the measured minimum value of the reflectance using Fresnel coefficients.

In the first thin film having voids as an optical thin film, the voidage is preferably in a range of 30% or more and 90% or less. When the voidage of the first thin film is 30% or more, the refractive index of the thin film can be lowered, and when the voidage of the first thin film is 90% or less, the refractive index of the thin film can be lowered while having an intensity for retaining the thin film formed on the object. In the first thin film as an optical thin film, the voidage is more preferably in a range of 40% or more and 90% or less, even more preferably in a range of 50% or more and 90% or less, still more preferably 60% or more and 85% or less. The voidage of the optical thin film (total porosity: Vp) can be determined using a Lorentz-Lorenz formula, based on the Examples described later.

Obtaining Second Thin Film Formed by Silica-Coating First Thin Film

The manufacturing method according to an embodiment of the present disclosure includes coating a surface of the first thin film with a silica-coat forming material to obtain a coated thin film and heat-treating the coated thin film to obtain a second thin film. The term silica as used in the present application refers to $SiO_2$, while the term silicon oxide refers to oxides of Si in general and includes, e.g., SiO and $SiO_2$. The second thin film is formed by silica-coating the first thin film formed on the object, and includes the first thin film and silica for coating the first thin film. In the manufacturing method according to an embodiment of the present disclosure, it is preferable that the silica-coat forming material is coated on a surface of the first thin film such that a silica-coat is formed on the whole of the first thin film having voids, and thereafter, the coated thin film is subjected to a heat treatment. A thickness of the silica-coating is from 0.1 nm to 30 nm. When the thickness of the silica-coating is too thin, a strength of the thin film will be insufficient. When the thickness of the silica-coating is too thick, the refractive index of the thin film will be high.

The silica-coat forming material preferably contains a silicon alkoxide. The silica-coat is preferably formed by a sol-gel method. The silicon alkoxide is preferably a silane compound having two or more alkoxyl groups. Specifically, it is preferable to use at least one silane compound selected from the group consisting of dimethyldiethoxysilane, diethyldiethoxysilane, methyltrimethoxysilane, methyltriethoxysilane, phenyltriethoxysilane, 3-glycidoxypropyltrimethoxysilane (GPTMS), tetramethoxysilane (TMOS), tetraethoxysilane (TEOS), tetraisopropoxysilane, and tetrabutoxysilane.

The silica-coat forming material preferably contains a solvent for improving the film-formation. Examples of the solvent may include: alcohols such as methanol, ethanol, isopropyl alcohol, and butanol; and ketones such as acetone, methyl ethyl ketone, cyclohexanone, and isophorone. The solvent may be used alone, or two or more kinds of the solvents may be used in combination. The silica-coat forming material preferably contains the silicon alkoxide and the solvent, and preferably a material to which a second acidic solution is further added.

In the case where the silica-coat forming material contains the silicon alkoxide, the manufacturing method according to an embodiment of the present disclosure may include adding a second acidic solution to the silica-coat forming material for hydrolyzing the silicon alkoxide. The pH value of the second acidic solution is preferably in a range of pH 0.8 or more and pH 1.8 or less, more preferably in a range of pH 1.0 or more and pH 1.5 or less. The mass ratio of the silicon alkoxide, the solvent, the second acidic solution (silicon alkoxide:solvent:second acidic solution) preferably 0.5 g:8.5 g to 20.0 g:0.21 g to 0.86, more preferably 0.5 g:11.0 g to 16.0 g:0.30 g to 0.64 g.

When the pH value of the second acidic solution to be added to the silica-coat forming material falls within the range of pH 0.8 or more and pH 1.8 or less, in the case where the silicon alkoxide is contained in the silica-coat forming material, the silicon alkoxide can be hydrolyzed, and thereafter can be subjected to a dehydration condensation. By coating a surface of the first thin film with the silica-coat forming material, a second thin film formed by silica-coating the first thin film can be obtained. The second thin film includes the first thin film and silica which is coated thereon, and thus sufficient film strength can be obtained. When the pH value of the second acidic solution to be added to the silica-coat forming material is less than pH 0.8 or more than pH 1.8, particle growth of the particles generated by the dehydration condensation of the silicon alkoxide is excessively promoted during the dehydration condensation, and thus the silica-coat for covering the surface of the first thin film is hardly obtained. The acidic substance contained in the second acidic solution to be added to the silica-coat forming material is preferably at least one selected from the group consisting of hydrochloric acid, sulfuric acid, oxalic acid, and acetic acid.

Examples of the method for coating the silica-coat forming material may include a spin coat method, a dip coat method, a spray coat method, a flow coat method, a bar coat method, a reverse coat method, a gravure coat method, and a printing method.

The temperature for the heat treatment after coating the silica-coat forming material on the surface of the first thin film may be a temperature capable of forming the silica-coat, preferably in a range of 250° C. or higher and 350° C. or lower, more preferably in a range of 280° C. or higher and 320° C. or lower. The time for the heat treatment may be a time capable of forming the silica-coat, preferably in a range of 0.5 hour or longer and 3 hours or shorter, more preferably in a range of 0.5 hour or longer and 2 hours or shorter.

Second Thin Film Formed by Silica-Coating First Thin Film: Optical Thin Film

It is preferable that the second thin film formed by silica-coating the first thin film includes silicon oxide, and the refractive index is 1.380 or less.

The second thin film as an optical thin film is formed by silica-coating so as to cover a surface of the silicon dioxide ($SiO_2$) serving as a framework of the first thin film. Since the silicon dioxide ($SiO_2$) serving as a framework of the first thin film has voids, it is presumed that the surface has a mesh shape, and silica is coated along the surface. The second thin film as an optical thin film is formed by silica-coating the surface of the first thin film, thereby having sufficient film strength.

The refractive index of the second thin film as an optical thin film is as low as 1.380 or less, and is a refractive index equal to or lower than 1.380 which is a refractive index of magnesium fluoride ($MgF_2$) known as a conventional low refractive material. Since the refractive index of the second thin film is as low as 1.380 or less, for example, when optical glass or plastic is used as an object to be film-formed, the refractive index of the second thin film becomes a value close to the square root of the refractive index of the object to be film-formed (from about 1.200 to about 1.300), and thus the anti-reflection effect can be enhanced. The refractive index of the second thin film formed by silica-coating the first thin film is preferably 1.380 or less, more preferably 1.300 or less, even more preferably 1.250 or less, still more preferably 1.200 or less.

Optical Member

The optical member, including the optical thin film according to an embodiment of the present disclosure and the object on which the optical thin film is formed, can be utilized as optical members for astronomic telescopes, glasses lenses, cameras, band pass filters, disc drive devices equipped with optical pickup parts such as a beam splitter, display devices equipped with high definition liquid crystal panels, etc. Further, by utilizing the optical thin film for extraction parts of outgoing light in a light emitting device, injection of the outgoing light from the light emitting device can be promoted. Thus, enhancement of the light extraction efficiency and reduction of the heat generation can be expected.

EXAMPLES

The present invention is hereunder specifically described by reference to the following Examples. However, the present invention is not limited to these Examples.

Example 1

Production of Thin Film Forming Material 160 g of indium oxide (III) powder ($In_2O_3$) (purity: 99.99% by mass) and 100 g of silicon monoxide powder (SiO) (purity: 99.9% by mass) were introduced into a nylon pod having a capacity of 1 L, a nylon ball having a diameter of 20 mm WO was introduced thereto together with these powders, and the introduced raw materials were mixed for 30 minutes while loosening the aggregated powder to obtain a raw material mixture. A molar ratio of the indium oxide relative to 1 mol of the silicon oxide (a molar ratio of $In_2O_3$/SiO) was 0.254. The raw material mixture was taken out from the pod, and was press-molded to form a molded body. The molded body was calcined at 800° C. for 2 hours in an inert atmosphere (argon (Ar): 99.99% by volume) to obtain a thin film forming material (sintered body) 1.

Production of First Vapor Deposition Film

As an object to be film-formed, a disc-shaped double-face polishing plate glass (BK-7, manufactured by SCHOTT AG) was used. The object to be film-formed and the thin film forming material 1 were set in a vapor deposition apparatus. In a state where the pressure in the vapor deposition apparatus was reduced to $1.0 \times 10^{-4}$ Pa, the thin film forming material 1 was irradiated with electron beam (JEBG-102UHO, manufactured by JEOL Ltd.) at 140 mA, thereby forming a vapor deposition film containing indium oxide (I) ($In_2O$) and a silicon dioxide ($SiO_2$) on one face of the object to be film-formed serving as a substrate. The temperature of the object to be film-formed in film-forming was set at 100° C. An ion-beam assisted deposition (IAD) (acceleration voltage value–acceleration current value=900 V–900 mA) using Ar ions which are released from an ion gun (NIS-150, manufactured by Shincron Co., Ltd.) in film-forming was used. In order to prevent a charge-up of the object to be film-formed, a neutralizer (RFN-2, with a bias current value of 1,000 mA, manufactured by Shincron Co., Ltd.) was simultaneously used.

Production of First Thin Film Having Voids

An oxalic acid solution having a pH 3.2 was used as a first acidic solution, the object to be film-formed on which the vapor deposition film was formed was immersed in the oxalic acid solution at room temperature, and indium oxide (I) ($In_2O$) was preferentially eluted from the vapor deposition film, thereby producing a first thin film having voids. A contact time (immersion time) between the vapor deposition film and the acidic solution was set to 90 minutes to obtain a first thin film having no absorption of visible light. A refractive index of the obtained first thin film having voids was measured according to the method described later. The first thin film having voids, in which the refractive index was 1.091, was obtained. The amount of indium oxide (III) ($In_2O_3$) and/or indium (In) contained in the first thin film was an amount in which the refractive index of the first thin film was decreased by 0.011 after bringing the first thin film into contact with the strong acidic solution having a pH 2.0 or less, and an amount in which the voidage was increased by around 3% (both the amounts include a dropped silicon dioxide ($SiO_2$)).

Production of Second Thin Film

As a silica-coat forming material, 0.5 g of tetraethoxysilane (TEOS, manufactured by Shin-Etsu Chemical Co., Ltd.) was added into 12.85 g of dehydrated ethanol, and thereafter, 0.47 g of hydrochloric acid having a pH 1.0 as a second acidic solution was added thereto. The prepared liquid was then mixed for 24 hours to produce a silica-coat forming material. The silica-coat forming material was dripped on the surface of the first thin film having voids, and impregnated the surface of the first thin film. Thereafter, an excess silica-coat forming material was eliminated from the surface of the first thin film by rotating the first thin film, the surface of the first thin film was coated with the silica-coat forming material, and the first thin film was retained at 300° C. for 1 hour, thereby producing a second thin film formed by silica-coating the first thin film. A refractive index of the obtained second thin film was 1.139.

Example 2

55 g of $In_2O_3$ powder and 100 g of SiO powder (a molar ratio of $In_2O_3$/SiO was 0.246) were mixed, and the mixture was sintered in the same manner as in Example 1 to obtain a thin film forming material 2. A first thin film having voids was produced in the same manner as in Example 1 except that the thin film forming material 2 was used, and the silica-coating was not formed. A refractive index of the obtained thin film was 1.140.

Example 3

A first thin film having voids was produced in the same manner as in Example 1 except that an oxalic acid solution having a pH 2.5 was used as the first acidic solution, and the silica-coating was not formed. A refractive index of the obtained thin film was 1.094.

Example 4

A first thin film having voids was produced in the same manner as in Example 1 except that an oxalic acid solution having a pH 2.7 was used as the first acidic solution, and the silica-coating was not formed. A refractive index of the obtained thin film was 1.093.

Example 5

A first thin film having voids was produced in the same manner as in Example 1 except that an oxalic acid solution having a pH 3.5 was used as the first acidic solution, and the silica-coating was not formed. A refractive index of the obtained thin film was 1.092.

Example 6

A first thin film having voids was produced in the same manner as in Example 1 except that a hydrochloric acid solution having a pH 3.0 was used as the first acidic solution, and the silica-coating was not formed. A refractive index of the obtained thin film was 1.095.

Example 7

A first thin film having voids was produced in the same manner as in Example 2 except that the ion-beam assisted deposition using Ar ions was not used, and the silica-coating was not formed. A refractive index of the obtained thin film was 1.266.

Comparative Example 1

140 g of $In_2O_3$ powder and 100 g of SiO powder (a molar ratio of $In_2O_3$/SiO was 0.222) were mixed, and the mixture was sintered in the same manner as in Example 7 to obtain a thin film forming material 3. A thin film having voids was produced in the same manner as in Example 7 except that the thin film forming material 3 was used, and the silica-coating was not formed. A refractive index of the obtained thin film was 1.321.

Comparative Example 2

180 g of $In_2O_3$ powder and 100 g of SiO powder (a molar ratio of $In_2O_3$/SiO was 0.286) were mixed, and the mixture was sintered in the same manner as in Example 1 to obtain a thin film forming material 4. A vapor deposition film was produced in the same manner as in Example 1 except that the thin film forming material 4 was used, and the vapor deposition film was brought into contact with the same first acidic solution as in Example 1. However, the vapor deposition film was detached from the object to be film-formed after the acid treatment, and thus a thin film having voids could not be obtained.

Comparative Example 3

A vapor deposition film was produced in the same manner as in Example 1 except that an oxalic acid solution having a pH 2.0 was used as the first acidic solution, and the vapor deposition film was brought into contact with the same first acidic solution as in Example 1. However, the vapor deposition film was detached from the object to be film-formed after the acid treatment, and thus a thin film having voids could not be obtained.

Comparative Example 4

A first thin film having voids was produced in the same manner as in Example 1 except that an oxalic acid solution having a pH 4.0 was used as the first acidic solution, and the silica-coating was not formed. The obtained thin film did not become transparent.

Evaluation of Thin Film (Optical Thin Film)

The first thin films which are optical thin films obtained in Examples and Comparative Examples were evaluated as follows. The results are shown in Table 1.

Refractive Index

A reflection spectrum of the thin film (optical thin film) having voids in each of Examples was measured using a spectrometer (U-4100, with an incident angle of 5°, manufactured by Hitachi High-Technologies Corp.). A minimum value of a reflected light intensity was measured as a reflectance when an incident light intensity was taken as 100. A refractive index was then calculated from the measured reflectance using Fresnel coefficients. The temperature of measured the thin film sample is room temperature, room temperature is in a range 18° C. to 25° C.

In each of Examples, the double-face polishing glass is used as the object to be film-formed serving as a substrate, which forms the thin film, and thus the reflectance R' obtained from the measurement contains multiple repeated reflection including rear-face reflection. Since the measured reflectance R' contains the multiple repeated reflection, a reflectance R of the thin film can be represented by the following formula (1).

$$R' = \frac{R_0 + R - 2R_0 R}{1 - R_0 R} \quad (1)$$

In the formula (1), the parameter $R_o$ represents a reflectance of the substrate (object to be film-formed). The reflectance R was calculated from the actually measured reflectance R' based on the formula (1). The reflectance R of the thin film is a reflectance without considering a reflection from the rear-face.

When using a Fresnel coefficient, the reflectance R of the thin film can be calculated from a refractive index nm of the substrate (object to be film-formed) and a refractive index n of the thin film, and can be represented by the following formula (2).

$$R = \frac{(n^2 - n_m)^2}{(n^2 + n_m)^2} \quad (2)$$

Here, in the case where a refractive index in the air is approximated to 1 and the refractive index n of the thin film is higher than the square root of the refractive index $n_m$ of the substrate, the refractive index n of the thin film can be represented by the following formula (3).

$$n = \left\{ \frac{n_m(1 + \sqrt{R})}{1 - \sqrt{R}} \right\}^{\frac{1}{2}} \text{ when } n > \sqrt{n_m} \quad (3)$$

In the case where the refractive index n of the thin film is lower than the square root of the refractive index nm of the substrate, the refractive index n of the thin film can be represented by the following formula (4).

$$n = \left\{ \frac{n_m(1 - \sqrt{R})}{1 + \sqrt{R}} \right\}^{\frac{1}{2}} \text{ when } n < \sqrt{n_m} \quad (4)$$

The refractive indices n of the first thin film and the second thin film, each serving as an optical thin film, were calculated based on the formulae (1) to (4). As to the refractive index n of the optical thin film, the document "Basic Theory of Optical Thin Film-Fresnel Coefficient and Characteristic Matrix-" written by Mitsunobu Kobiyama and published by Optronics Co., Ltd. on Feb. 25, 2011 (enlarged and revised edition—first copy) was referred.

Voidage (%)

Voidages (total porosity: Vp) of the first thin film and the second thin film, each serving as an optical thin film, were determined using a Lorentz-Lorenz formula as shown in the following formula (5). In the formula (5), the parameter of represents an observed refractive index of the thin film, and the parameter $n_b$ represents a refractive index of the framework of the thin film. The refractive index $n_f$ of the thin film is a refractive index of the thin film (optical thin film) having voids which is determined based on the formulae (1) to (4). The refractive index $n_b$ of the framework of the thin film was determined using a refractive index (1.460) of a silicon dioxide ($SiO_2$), since the framework of the thin film mainly contained the silicon dioxide ($SiO_2$).

$$Vp = 1 - \frac{(n_f^2 - 1)}{(n_f^2 + 2)}\left(\frac{(n_b^2 - 1)}{(n_b^2 + 2)}\right)^{-1} \quad (5)$$

Absorption Rate (%)

An absorption rate of the thin film (optical thin film) having voids in each of Examples was measured using a spectrometer (U-4100, with an incident angle of 5°, manufactured by Hitachi High-Technologies Corp.). A reflected light intensity and a transmitted light intensity were measured when an incident light intensity was taken as 100, and a value subtracting the measured values from the incident light intensity of 100 was measured as the absorption rate. Since the absorption rate becomes high at the short wavelength side, an average value of 390 to 410 nm was adopted.

TABLE 1

|  | $In_2O_3$/SiO Molar ratio | IAD | First acidic solution Kind of acidic substance | pH | First thin film (without silica-coat) Refractive index | Voidage (%) |
|---|---|---|---|---|---|---|
| Example 1 | 0.254 | used | oxalic acid | 3.2 | 1.091 | 78.2 |
| Example 2 | 0.246 | used | oxalic acid | 3.2 | 1.140 | 66.8 |
| Example 3 | 0.254 | used | oxalic acid | 2.5 | 1.094 | 77.5 |
| Example 4 | 0.254 | used | oxalic acid | 2.7 | 1.093 | 77.8 |
| Example 5 | 0.254 | used | oxalic acid | 3.5 | 1.092 | 78.0 |
| Example 6 | 0.254 | used | hydrochloric acid | 3.0 | 1.095 | 77.3 |
| Example 7 | 0.246 | not used | oxalic acid | 3.2 | 1.266 | 42.6 |
| Comparative Example 1 | 0.222 | not used | oxalic acid | 3.2 | 1.321 | 27.4 |
| Comparative Example 2 | 0.286 | used | oxalic acid | 3.2 | disappeared after acid treatment | — |
| Comparative Example 3 | 0.254 | used | oxalic acid | 2.0 | disappeared after acid treatment | — |
| Comparative Example 4 | 0.254 | used | oxalic acid | 4.0 | remained as black | — |

As shown in Table 1, the refractive index of the first thin film obtained in each of Examples 1 to 7 could be lowered as being 1.300 or less. In the first thin film using the ion-beam assisted deposition (IAD) with Ar ions in each of Examples 1 to 6, the refractive index could be further lowered as being 1.170 or less. As to the first thin film obtained in Example 1, when measuring the absorption rate from the transmittance and the reflectance using a spectrometer, it could be confirmed that the absorption rate was sufficiently low, the indium oxide (I) ($In_2O$) and/or indium (In) of which the body color was black was not present in the thin film, and all of the indium oxide (I) ($In_2O$) and/or indium (In) in the thin film were eluted by contact with the acidic substance. It could be also confirmed that, in the first thin film obtained in Example 1, the silicon monoxide (SiO) of which the body color was black was not present.

As shown in Comparative Example 1, the molar ratio of the thin film forming material ($In_2O_3$/SiO) was 0.222. When the molar ratio of the thin film forming material ($In_2O_3$/SiO) was below 0.230, the refractive index of the first thin film was 1.321, and was not be 1.300 or less. As shown in Comparative Example 2, the molar ratio of the thin film forming material ($In_2O_3$/SiO) was 0.286. When the molar ratio of the thin film forming material ($In_2O_3$/SiO) was more than 0.270, the vapor deposition film was detached by contact with the first acidic solution, and the first thin film having voids could not be formed at a desired area of the object to be film-formed.

As shown in Comparative Example 3, when the pH value of the first acidic solution was too low, the vapor deposition film was detached after the contact, and the first thin film having voids could not be formed at a desired area of the object to be film-formed. Further, as shown in Comparative Example 4, when the pH value of the first acidic solution was too high, a black substance was found in the first thin film, and thus the indium oxide (I) ($In_2O$) and/or indium (In), which was the black substance, could not be eluted.

Next, Examples 1 and 8 to 14, each explaining the second thin film formed by silica-coating the first thin film, will be described.

Example 8

A second thin film which was silica-coated with the first thin film was produced in the same manner as in Example 1 except that a hydrochloric acid solution having a pH 1.5 was used as the second acidic solution to be added to the silica-coat forming material. A refractive index of the obtained second thin film was 1.171.

Example 9

A second thin film which was silica-coated with the first thin film was produced in the same manner as in Example 1 except that 3-glycidoxypropyltrimethoxysilane (GPTMS) was used as the silicon alkoxide of the silica-coat forming material. A refractive index of the obtained second thin film was 1.178.

Example 10

A second thin film which was silica-coated with the first thin film was produced in the same manner as in Example 1 except that a hydrochloric acid solution having a pH 0.5 was used as the second acidic solution to be added to the silica-coat forming material. A refractive index of the obtained second thin film was 1.159.

Example 11

A second thin film which was silica-coated with the first thin film was produced in the same manner as in Example 1 except that a hydrochloric acid solution having a pH 2.0 was used as the second acidic solution to be added to the silica-coat forming material. A refractive index of the obtained second thin film was 1.151.

Example 12

A second thin film which was silica-coated with the first thin film was produced in the same manner as in Example 1 except that a hydrochloric acid solution having a pH 3.0 was used as the second acidic solution to be added to the silica-coat forming material. A refractive index of the obtained second thin film was 1.100.

Example 13

A second thin film which was silica-coated with the first thin film was produced in the same manner as in Example 1 except that a hydrochloric acid solution having a pH 4.0 was used as the second acidic solution to be added to the silica-coat forming material. A refractive index of the obtained second thin film was 1.120.

Example 14

A second thin film which was silica-coated with the first thin film was produced in the same manner as in Example 1 except that a hydrochloric acid solution having a pH 5.0 was used as the second acidic solution to be added to the silica-coat forming material. A refractive index of the obtained second thin film was 1.107.

Evaluation of Thin Film (Optical Thin Film)

As an evaluation of the second thin film obtained in each of Examples 1 and 8 to 14, the refractive index and the voidage were evaluated in the same manner as the evaluation of the first thin film in Example 1. The results are shown in Table 2.

Film Strength Test

A sheet of lens-cleaning paper was overlapped on the second thin film (optical thin film) formed by silica-coating the first thin film. Using a pencil hardness tester (according to JIS K 5600, scratch hardness (pencil method)), a disk of 1 $cm^2$ using in the pencil hardness tester was moved 20 cycles on the lens-cleaning paper in a dry method while applying a load of 500 $g/cm^2$. The lens-cleaning paper was removed, and the surface of the second thin film (optical thin film) was visually observed. The state of the surface thereof was evaluated by the following criteria. A state in which a scratch or a color change of reflected light was found was judged as bad (B), and a state in which a change on the surface of the second thin film was not found was judged as good (G). The results are shown in Table 2. Even the thin films which were evaluated as bad (B) had a superior film strength as compared to the thin films having no silica-coat.

SEM Micrograph

Figure 2:
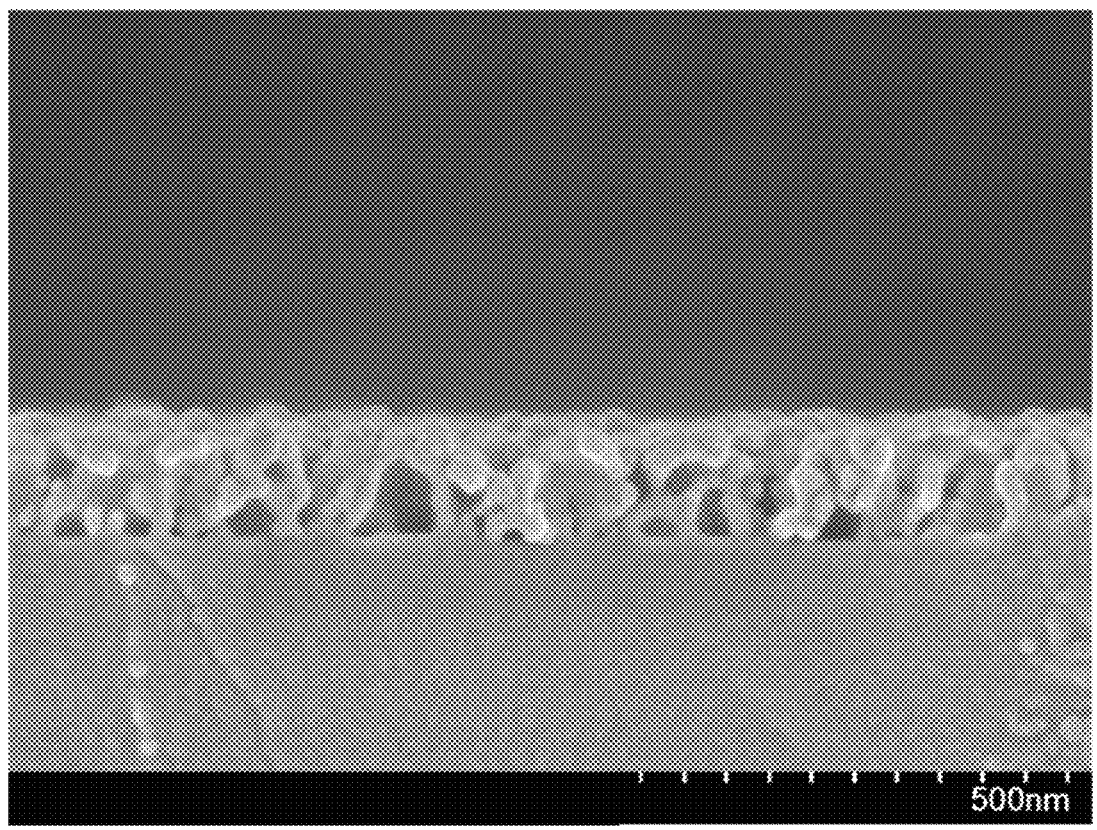
FIG. 2 is a SEM micrograph showing a cross section of an optical thin film according to Example 1 of the present disclosure.

Using a scanning electron microscope (SEM), SEM micrographs of the second thin film which was silica-coated with the first thin film were obtained. FIG. 1 is a SEM micrograph showing a surface of the second thin film (optical thin film) in Example 1, and FIG. 2 is a SEM micrograph showing a cross section of the second thin film (optical thin film) in Example 1.

TABLE 2

|  | In$_2$O$_3$/SiO Molar ratio | First acidic solution | | First thin film (without silica-coat) | | Silica-coat | | Second thin film (first thin film + silica-coat) | | Film strength evaluation |
| --- | --- | --- | --- | --- | --- | --- | --- | --- | --- | --- |
|  |  | Kind of acidic substance | pH | Refractive index | Voidage (%) | Silica source | pH | Refractive index | Voidage (%) |  |
| Example 1 | 0.254 | oxalic acid | 3.2 | 1.091 | 78.2 | TEOS | 1.0 | 1.139 | 67.1 | G |
| Example 8 | 0.254 | oxalic acid | 3.2 | 1.090 | 78.5 | TEOS | 1.5 | 1.171 | 59.8 | G |
| Example 9 | 0.254 | oxalic acid | 3.2 | 1.094 | 77.5 | GPTMS | 1.5 | 1.178 | 58.2 | G |
| Example 10 | 0.254 | oxalic acid | 3.2 | 1.096 | 77.1 | TEOS | 0.5 | 1.159 | 62.5 | B |
| Example 11 | 0.254 | oxalic acid | 3.2 | 1.094 | 77.5 | TEOS | 2.0 | 1.151 | 64.3 | B |
| Example 12 | 0.254 | oxalic acid | 3.2 | 1.095 | 77.3 | TEOS | 3.0 | 1.100 | 76.1 | B |
| Example 13 | 0.254 | oxalic acid | 3.2 | 1.098 | 76.6 | TEOS | 4.0 | 1.120 | 71.5 | B |
| Example 14 | 0.254 | oxalic acid | 3.2 | 1.096 | 77.1 | TEOS | 5.0 | 1.107 | 74.5 | B |

As shown in Table 2, the refractive index of the first thin film obtained in each of Examples 1 and 8 to 14 was 1.300 or less, and more specifically the refractive index could be lowered as being 1.098 or less. As to the second thin film formed by silica-coating the first thin film produced in each of Examples 1 and 8 to 14, the refractive index was 1.380 or less, more specifically 1.178 or less, and could be lowered than the refractive index (1.380) of magnesium fluoride (MgF$_2$) known as a conventional low refractive material.

Even in the case of using the silica-coat forming material to which the second acidic solution having a pH 1.0 was added as shown in Example 1, in the case of using the silica-coat forming material to which the second acidic solution having a pH 1.5 was added as shown in Example 8, and in the case of using the silica-coat forming material containing 3-glycidoxypropyltrimethoxysilane (GPTMS) as shown in Example 9, the obtained second thin films exhibited sufficient film strength.

When the silica-coat forming material to which the second acidic solution having a high pH value higher than 1.8 was added as shown in Examples 11 to 14, and when the silica-coat forming material to which the second acidic solution having a low pH value lower than 0.8 was added as shown in Example 10, the second thin films could not exhibit sufficient film strength.

As shown in FIG. 1, in the first thin film obtained in Example 1, voids formed by eluting the indium oxide (I) (In$_2$O) are present in the framework containing the silicon dioxide (SiO$_2$). As shown in FIG. 2, when observing a cross section of the second thin film formed by silica-coating the first thin film obtained in Example 1, it can be confirmed that the framework formed by the silicon dioxide (SiO$_2$) is serially formed from the object on which an optical thin film is formed to the surface of the optical thin film, and has a different shape from a thin film constituted by, for example, an aggregate of silica particles.

With the method for producing a thin film according to an embodiment of the present disclosure, an optical thin film having a low refractive index can be relatively easily produced, and an optical thin film, which can be utilized for not only camera lenses but also high definition liquid crystal panels etc., can be provided. The optical thin film according to an embodiment of the present invention can be utilized as optical members for astronomic telescopes, glasses lenses, cameras, band pass filters, disc drive devices equipped with optical pickup parts such as a beam splitter, display devices equipped with high definition liquid crystal panels, etc.

The invention claimed is:

1. A thin film forming material comprising a mixture consisting of indium oxide and silicon oxide, wherein the indium oxide is contained in a range of 0.230 mol or more and 0.270 mol or less relative to 1 mol of the silicon oxide.

2. The thin film forming material according to claim 1, wherein the silicon oxide comprises a silicon monoxide as a major component.

3. An optical thin film comprising a framework consisting of silicon oxide and voids, wherein a refractive index of the optical thin film is 1.178 or less.

4. The optical thin film according to claim 3, wherein a voidage in the optical thin film is in a range of 30% or more and 90% or less.

5. An optical member comprising an object and the optical thin film according to claim 3 formed on the object.

6. A film comprising:
 the optical thin film according to claim 3,
 a silica-coating on a surface of the optical thin film according to claim 3,
 wherein a refractive index of the film is 1.380 or less.

* * * * *